(12) United States Patent
Varghese et al.

(10) Patent No.: US 11,380,691 B1
(45) Date of Patent: Jul. 5, 2022

(54) CMOS OVER ARRAY OF 3-D DRAM DEVICE

(71) Applicant: Applied Materials, Inc., Santa Clara, CA (US)

(72) Inventors: Sony Varghese, Manchester, MA (US); Fred Fishburn, Aptos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/230,591

(22) Filed: Apr. 14, 2021

(51) Int. Cl.
*H01L 27/108* (2006.01)

(52) U.S. Cl.
CPC .... *H01L 27/10894* (2013.01); *H01L 27/1085* (2013.01); *H01L 27/10805* (2013.01); *H01L 27/10873* (2013.01); *H01L 27/10897* (2013.01)

(58) Field of Classification Search
CPC ......... H01L 27/10894; H01L 27/10805; H01L 27/1085; H01L 27/10873; H01L 27/10897
See application file for complete search history.

(56) References Cited

U.S. PATENT DOCUMENTS

| 4,690,729 | A | * | 9/1987 | Douglas | H01L 21/3085 438/719 |
|---|---|---|---|---|---|
| 2019/0348287 | A1 | * | 11/2019 | Varghese | H01L 21/0332 |
| 2021/0020452 | A1 | * | 1/2021 | Seidel | H01L 21/31122 |
| 2021/0125994 | A1 | * | 4/2021 | Varghese | H01L 29/41741 |

FOREIGN PATENT DOCUMENTS

| CN | 101140935 | A | * | 3/2008 | ....... H01L 27/10829 |
|---|---|---|---|---|---|
| JP | 2002043246 | A | * | 2/2002 | |

* cited by examiner

*Primary Examiner* — Edward Chin
(74) *Attorney, Agent, or Firm* — KDB Firm PLLC

(57) ABSTRACT

Disclosed are 3-D DRAM devices and methods of forming 3-D DRAM devices. One method may include forming a stack of DRAM device layers, forming a MOS substrate directly atop the stack of alternating DRAM device layers, and forming a trench through the MOS substrate and the stack of DRAM device layers. The method may further include depositing a protection layer over the MOS substrate, wherein the protection layer is deposited at a non-zero angle of inclination relative to a vertical extending from a top surface of the MOS substrate.

20 Claims, 6 Drawing Sheets

CMOS OVER ARRAY OF 3-D DRAM DEVICE

FIELD

The present embodiments relate to processing of 3-D dynamic random access memory (DRAM) devices, and more particularly, to approaches for forming a complementary metal-oxide-semiconductor (CMOS) over array 3-D DRAM devices.

BACKGROUND

As dynamic random-access memory (DRAM) devices scale to smaller dimensions, an increasing emphasis is placed on patterning for forming three dimensional structures, including trenches for storage nodes as well as access transistors. In current DRAM devices, transistors may be formed using narrow and tall, vertical semiconductor fin structures, often made from monocrystalline silicon. In accordance with current trends, the aspect ratio of such fin structures, meaning the height (depth) of a fin divided by the spacing between adjacent fins, may reach 20:1 or more in the coming years.

In an effort to continue scaling smaller, $4F^2$ DRAM devices have been developed. However, current $4F^2$ DRAM devices have off-leakage current issues for vertical channel transistors. The off-leakage current is caused by the floating body effect caused by hole accumulation into the body of the $4F^2$ DRAM device. With respect to these and other considerations, the present disclosure is provided.

SUMMARY OF THE DISCLOSURE

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In view of the foregoing, a method may include forming a stack of DRAM device layers, forming a MOS substrate directly atop the stack of alternating DRAM device layers, and forming a trench through the MOS substrate and the stack of DRAM device layers. The method may further include depositing a protection layer over the MOS substrate, wherein the protection layer is deposited at a non-zero angle of inclination relative to a vertical extending from a top surface of the MOS substrate.

In some approaches, a method of forming a dynamic random-access memory (DRAM) device may include forming a stack of DRAM device layers, forming a complementary metal-oxide-semiconductor (CMOS) substrate directly atop the stack of alternating DRAM device layers, and forming a trench through the CMOS substrate and the stack of DRAM device layers. The method may further include depositing a protection layer over an upper surface and a sidewall of the CMOS substrate, wherein the protection layer is deposited at a non-zero angle of inclination relative to a vertical extending from a top surface of the CMOS substrate, and wherein the protection layer is prevented from being formed along the stack of DRAM device layers within the trench.

In some approaches, a method of forming a dynamic random-access memory (DRAM) device may include epitaxially forming a stack of alternating silicon and silicon germanium layers, forming a complementary metal-oxide-semiconductor (CMOS) substrate directly atop the stack of alternating silicon and silicon germanium layers, and forming a trench through the CMOS substrate and the stack of alternating silicon and silicon germanium layers. The method may further include depositing a protection layer over an upper surface and a sidewall of the CMOS substrate, wherein the protection layer is deposited at a non-zero angle of inclination relative to a vertical extending from a top surface of the CMOS substrate, and wherein the protection layer is prevented from being formed along the stack of DRAM device layers within the trench.

BRIEF DESCRIPTION OF THE DRAWINGS

By way of example, embodiments of the disclosure will now be described, with reference to the accompanying drawings, in which.

Figure 1:
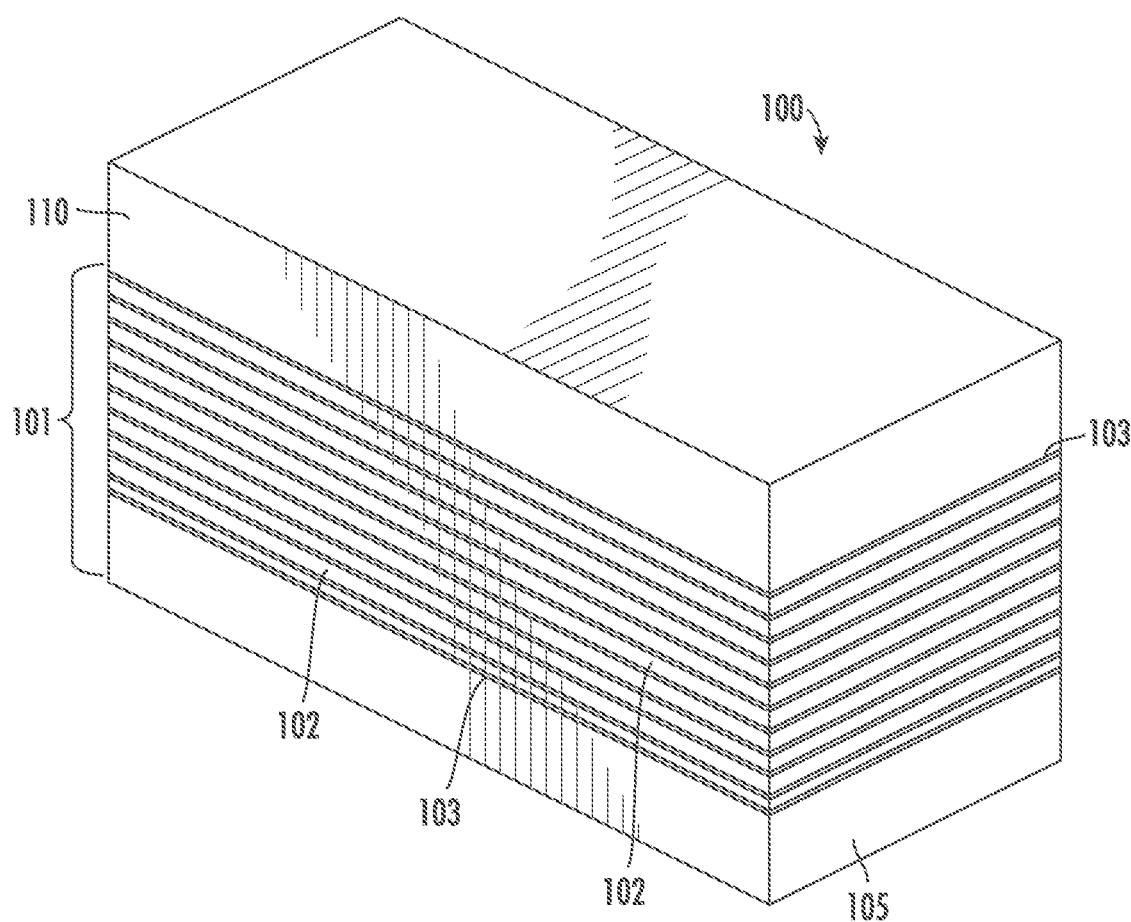
FIG. 1 is a perspective view of a stack of layers in accordance with embodiments of the present disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Methods and devices in accordance with the present disclosure will now be described more fully hereinafter with reference to the accompanying drawings, where embodiments of the methods and devices are shown. The methods and devices may be embodied in many different forms and are not to be construed as being limited to the embodiments set forth herein. Instead, these embodiments are provided so the disclosure will be thorough and complete, and will fully convey the scope of the system and method to those skilled in the art.

The present embodiments provide novel devices and methods for forming such devices, such as a CMOS over array 3-D DRAM. Unlike conventional CMOS over array processes for 3-D NAND devices, wherein two wafers are attached together by a bonding process, embodiments of the present disclosure provide a thick CMOS substrate layer formed atop an epitaxially formed 3-D DRAM stack of layers (e.g., silicon (Si) and silicon germanium (SiGe). To avoid damage to the CMOS substrate layer atop the DRAM stack during subsequent processing steps, a protection layer is deposited atop exposed surfaces of the CMOS substrate layer. In some embodiments, a directional deposition process is used to form a layer of dielectric oxide, silicon nitride, silicon carbon nitride, or other suitable material. During a subsequent lateral etch process to the DRAM stack, the protection layer prevents the etch from impacting the CMOS substrate.

Turning now to FIG. 1, there is shown a structure 100, such as a plurality of layers of a DRAM device, according to embodiments of the disclosure. Although non-limiting, the structure 100 may be used to make transistors and arrays of devices, such as DRAM arrays, having superior properties, including more uniformity in performance between devices, higher device yield, and so forth. As shown, the structure 100 may include a stack 101 of first and second alternating layers 102, 103 wherein the first and second layers 102, 103 may be formed atop a substrate base 105. In some embodiments, the first layers 102 may be epitaxially grown Si and the second layers 103 may be epitaxially grown SiGe. Formed atop the stack 101 may be a CMOS substrate 110. In some embodiments, the CMOS substrate 110 may be a relatively thicker layer of Si, which is epitaxially grown atop an uppermost layer of SiGe. In other embodiments a different material for the CMOS substrate 110 may be used.

Although not specifically shown, the stack 101 of the structure 100 may include an array of memory cells arranged in vertical pillars along a horizontal direction. Memory cells may be stacked vertically in each of these pillars with each memory cell, such as a DRAM cell, coupled to a pillar wordline that controls the channel of each of the DRAM cells. A pillar wordline is a wrap-around gate that runs in and along a pillar to which DRAM cells of the respective pillar are coupled. A DRAM cell at each vertical level in a pillar is part of a tier, where a DRAM having 128 DRAM cells in each pillar has 128 tiers, for example. In some embodiments, the stack 101 may further include a conductive digitline coupled to each pillar, along the horizontal direction, by a select device. These select devices may be realized by transistors in the CMOS substrate 110. In other embodiments the pillar could be a bitline extending vertically and coupled to the DRAM cell. The wordline, or gate in this case, would be in the horizontal direction.

Figure 2:
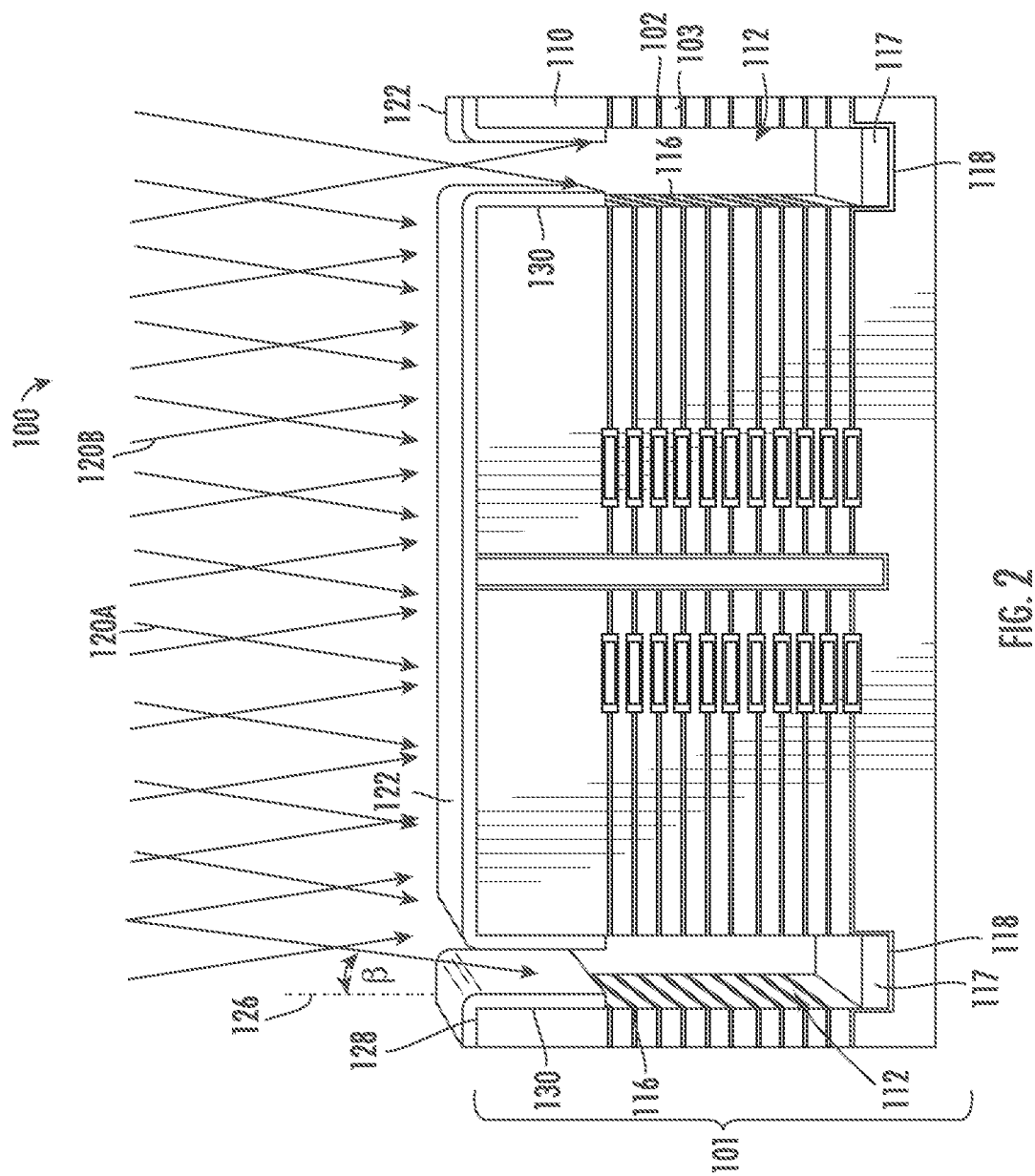
FIG. 2 is a side perspective view demonstrating formation of a protection layer over the device in accordance with embodiments of the present disclosure.
Figure 3:
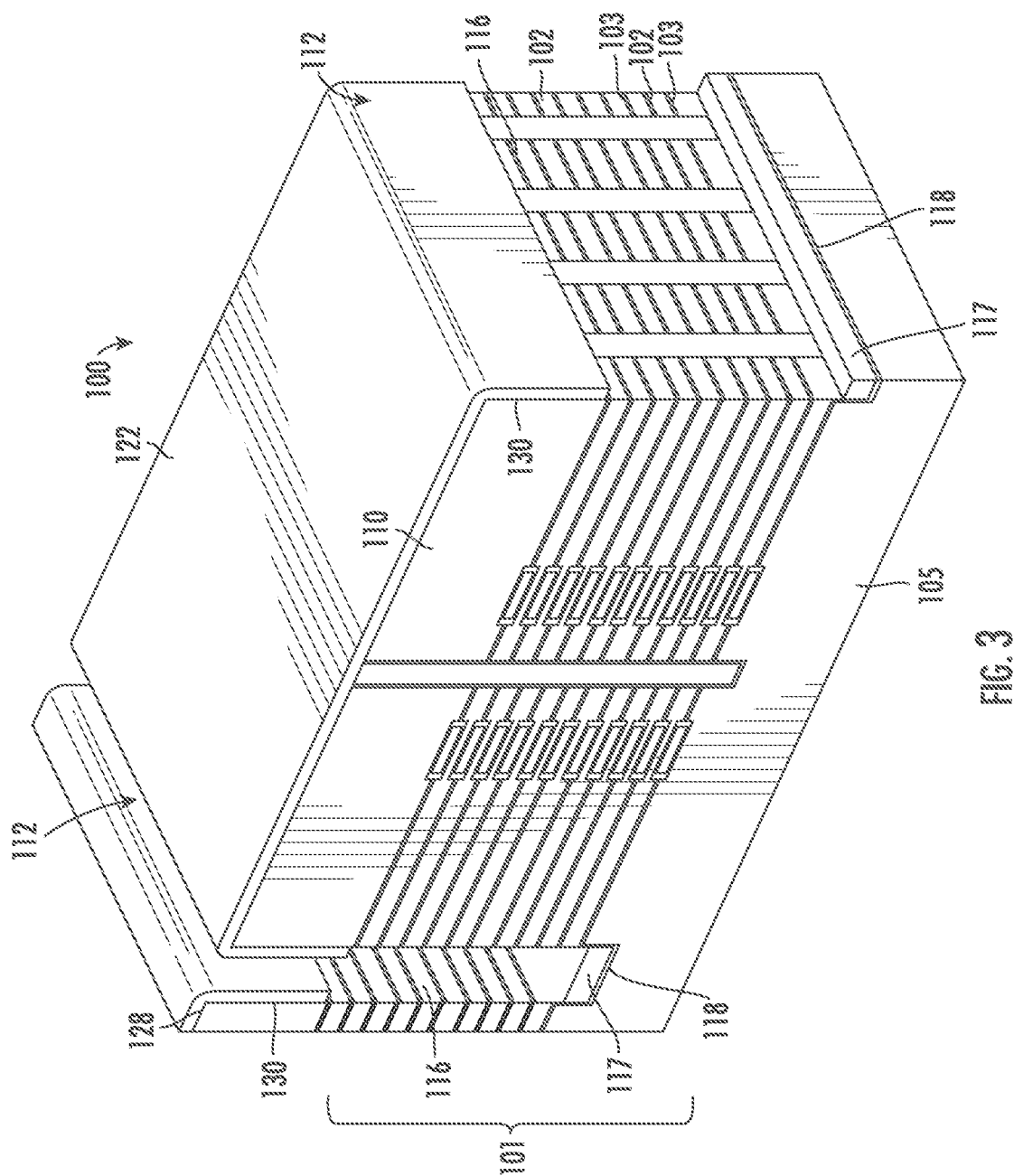
FIG. 3 is a perspective view of the device following deposition of the protection layer in accordance with embodiments of the present disclosure.

Next, as demonstrated in FIGS. 2-3, one or more trenches 112 may be formed through the structure 100. In some embodiments, the trenches 112 may be formed by a high aspect ratio (e.g., 5:1) slit etch process to remove a portion of the CMOS substrate 110, the first alternating layers 102, and the second alternating 103. Although non-limiting, the trenches 112 may be recessed to expose a trench dielectric layer 117 (e.g., silicon oxide or silicon nitride). As shown, the trenches 112 may be defined by one or more sidewalls 116 and a bottom surface 118.

As further shown, a deposition process 120A, 120B (FIG. 2) may be performed to form a protection layer 122 over the CMOS substrate 110. In some embodiments, the protection layer 122 is conformally deposited at a non-zero angle of inclination (+/−β) relative to a vertical 126 extending from a top surface 128 of the CMOS substrate 110. The angle of inclination may be selected so the protection layer 122 is formed along the top surface 128 and a sidewall 130 of the CMOS substrate 110 but not along the exposed portion of the first and second layers 102, 103 within the trenches 112. Although non-limiting, the protection layer 122 may be a dielectric oxide, a silicon nitride, a silicon carbon nitride, or other suitable material. The angle of inclination β may vary in other embodiments so the deposition process 120 impacts more or less of the sidewall 116 of the trenches 112. Still furthermore, the structure 100 may be rotated during or between successive depositions so each sidewall 116 of the trenches 112 is impacted. For example, the structure 100 may be rotated between each deposition process by 180°, to deposit on both side. A combination of other angles such as 45°, 90° may be used to deposit films in other desired locations on the structure 100. The film may also be deposited in two directions at the same time where the deposited species reaches the device in both +β and −β angles with respect to the vertical 126.

Figure 4:
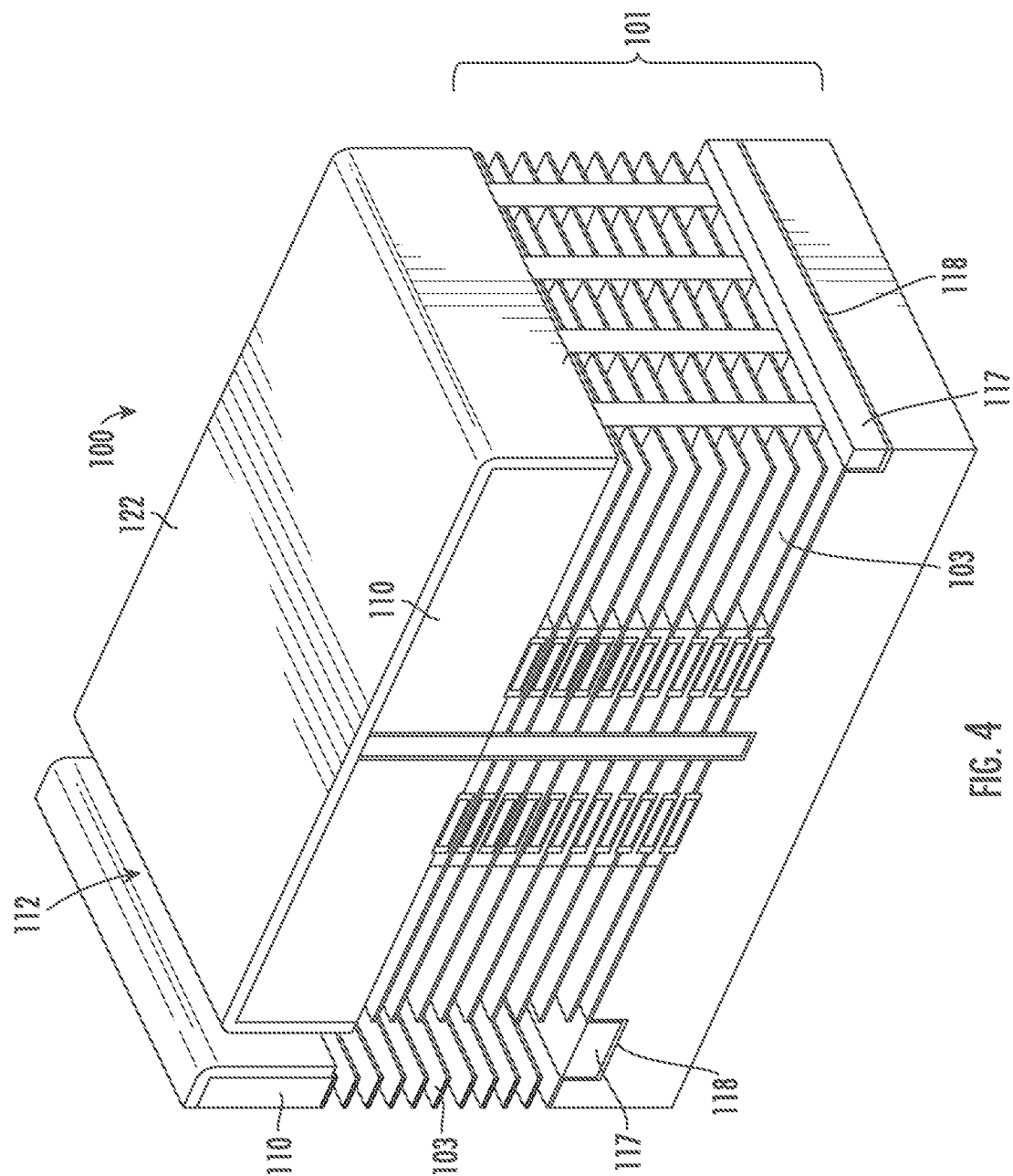
FIG. 4 is a perspective view of the device following removal of a portion of a DRAM device stack of the device in accordance with embodiments of the present disclosure.

FIG. 4 demonstrates the results of a lateral etch process performed to the device after the protection layer 122 is formed over the CMOS substrate 110. As shown, the first layers 102 (e.g., silicon) are removed from the stack 101 without removing any portion of the CMOS substrate 110, as the protection layer 122 prevents the etch from impacting the CMOS substrate 110. As further shown, the SiGe of the second layers 103 may remain following the lateral etch process. In some embodiments, the lateral etch process is a wet etch using, e.g., a potassium hydroxide solution. Although not shown, following the lateral etch process, the etched back first layers 102 may be further cleaned and doped by diffusion, epitaxy, or plasma doping. Transistor formation may then commence, whereby the protection layer 122 is removed (e.g., etched) and a capacitor film layer (not shown) is formed in the etched back area, i.e., where the first layers 102 were removed from the stack 101 by the lateral etch, to begin processing the transistor of the device. Although non-limiting, the protection layer 122 may be removed using a vertical etch process. In another example, ions may be delivered to the structure 100 at a non-zero angle of inclination to etch the protection layer 122 from along the sidewall 130 of the CMOS substrate 110. Embodiments herein are not limited in this context, however.

Figure 5:
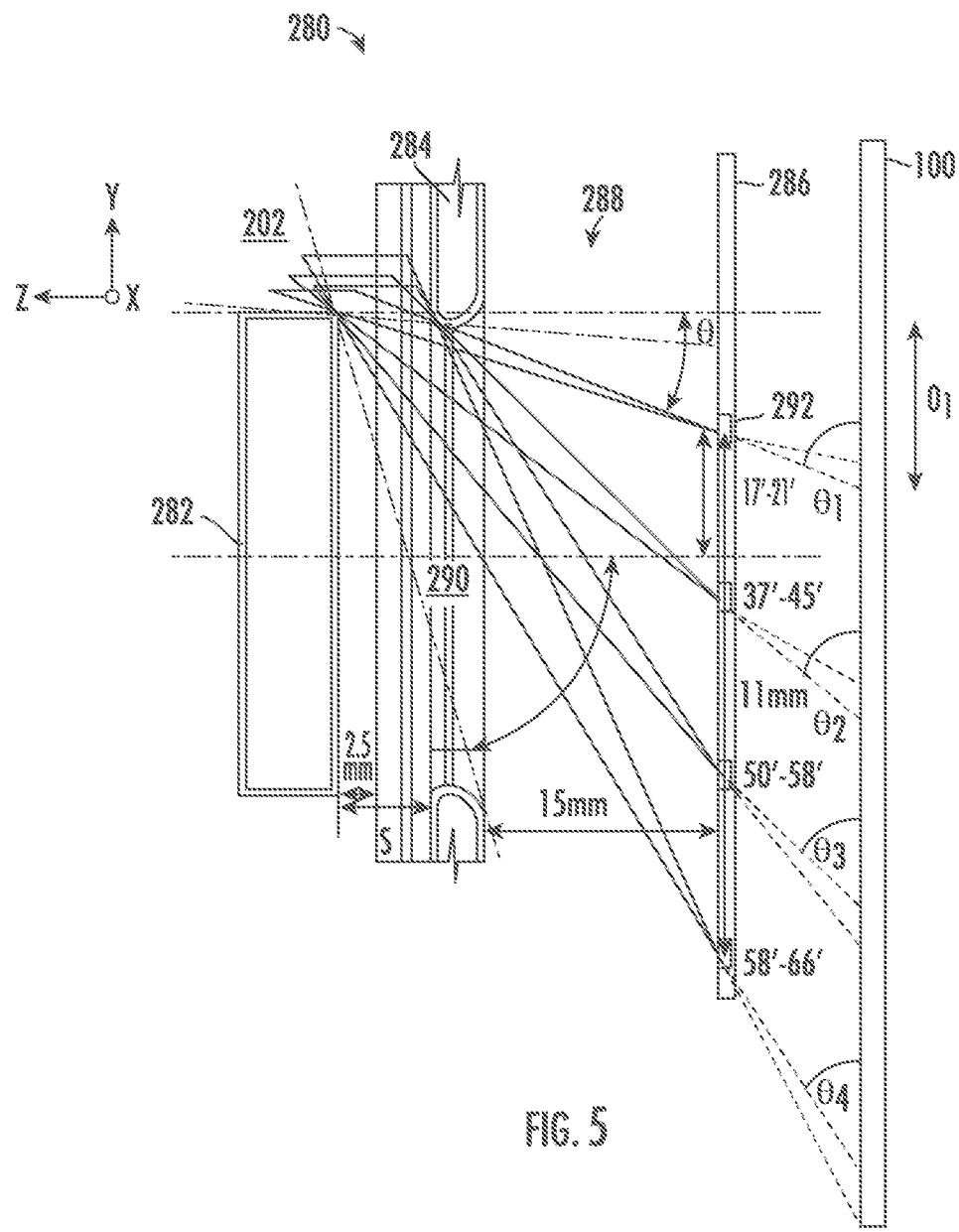
FIG. 5 illustrates a schematic diagram of an extraction assembly according to embodiments of the present disclosure.

FIG. 5 shows a side view of another apparatus according to embodiments of the disclosure. As shown, an extraction assembly 280 may be coupled to the plasma chamber 202, and include an extraction plate 284 and a beam blocker 282. The extraction assembly 280 may further include a collimation plate 286, disposed between the extraction plate 284 and the structure 100. Extraction of an ion beam 288 may be achieved by a bias voltage applied between the plasma chamber 202 and the structure 100, depending upon the targeted ion energy. To generate the angled ion beam 288, the beam blocker 282 may be arranged to block a portion of the aperture 290, formed with the extraction plate 284, so that the ion beam 288 is extracted from the plasma chamber 202 along the edge of the aperture 290, as shown.

Notably, ions may exit the plasma chamber 202 over a range of angles. To select for a given angle of incidence (or narrow range of angles of incidence) (θ), the collimation plate 286 may be provided with a collimation aperture 292 arranged at a specific offset 'O' with respect to an edge of the aperture 290. FIG. 5 illustrates four possible placements for the collimation aperture 292. Increasing the value of O will lead to a higher value of θ. In FIG. 5, for an offset $O_1$, the corresponding q1 is 17-21 degrees. Larger offsets will produce larger angles of incidence. Thus, for a given placement of the collimation aperture 292, ions exiting the plasma chamber 202 will be blocked from traversing to the structure 100, except those ions having the suitable angle of incidence to pass through the collimation aperture 292 and strike the structure 100. Thus, by switching between different collimation plates having different value of O, the apparatus of FIG. 5 presents a convenient means to vary the angle of incidence of ions of the ion beam 288 to be applied to the structure 100 to change the coverage of the protection layer 122 on the stack 101, as generally shown in FIG. 2.

Figure 6:
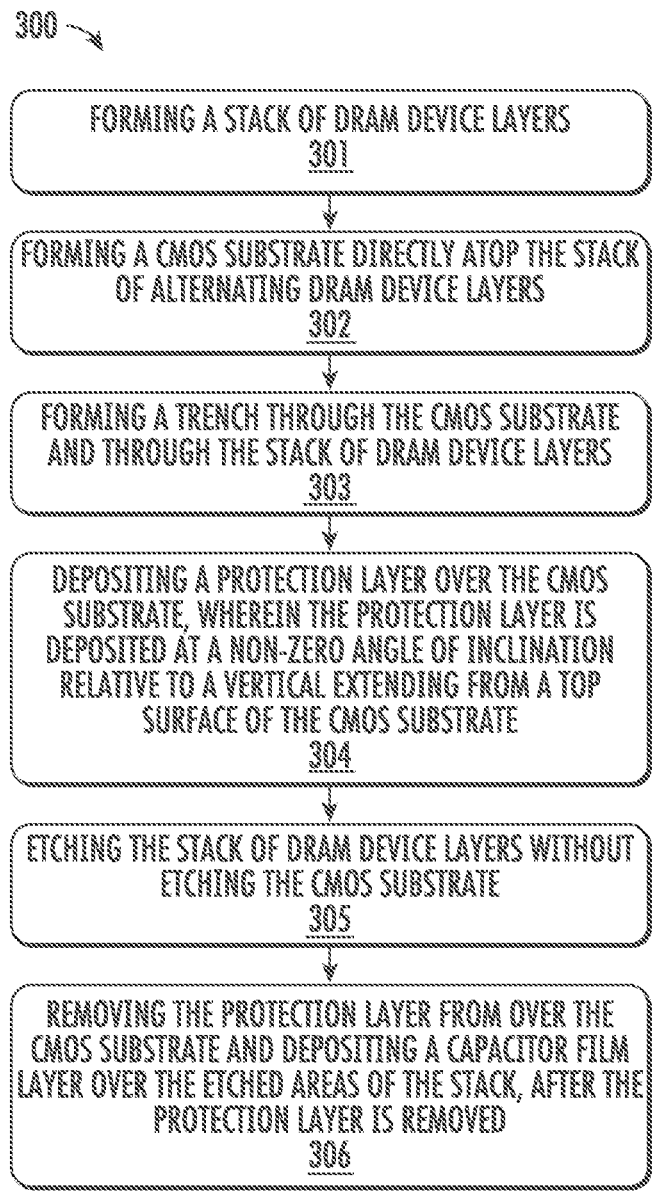
FIG. 6 is a process flow demonstrating a method in accordance with embodiments of the present disclosure.

Turning now to FIG. 6, a process 300 according to embodiments of the present disclosure is shown. At block 301, the process 300 may include forming a stack of DRAM device layers. In some embodiments, the stack of DRAM device layers includes alternating Si and SiGe layers epitaxially grown. In some embodiments, the stack of DRAM device layers defines a portion of a 3-D DRAM array.

At block 302, the process 300 may include forming a CMOS substrate directly atop the stack of alternating DRAM device layers. In some embodiments, the CMOS substrate may be a relatively thicker layer of Si epitaxially grown over one of the SiGe layers. In other embodiments, a different material is used for the CMOS substrate.

At block 303, the process 300 may include forming a trench through the CMOS substrate and through the stack of DRAM device layers. In some embodiments, the trench is a high aspect ratio slit formed partially through the stack.

At block 304, the process 300 may include depositing a protection layer over the CMOS substrate, wherein the protection layer is deposited at a non-zero angle of inclination relative to a vertical extending from a top surface of the CMOS substrate. In some embodiments, the protection layer is formed just along a sidewall of the CMOS substrate without being formed along exposed portions of the Si/SiGe within the trench. In some embodiments, the protection layer is a layer of dielectric oxide, silicon nitride, or silicon carbon nitride.

At block 305, the process 300 may include etching the stack of DRAM device layers without etching the CMOS substrate. More specifically, in some embodiments, a lateral etch process may be formed to remove the silicon of the first layers of the stack without removing the SiGe of the second layers or the silicon of the CMOS substrate.

At optional block 306, the process 200 may include removing the protection layer from over the CMOS substrate and depositing one or more capacitor film layers, such as metal and Hi-k dielectric, in the etched back silicon area after the protection layer is removed to begin processing the transistor of the device.

In various embodiments, design tools can be provided and configured to create the datasets used to pattern the semiconductor layers of the device, e.g., as described herein. For example, data sets can be created to generate photomasks used during lithography operations to pattern the layers for structures as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance running software, or implemented in hardware.

As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Although various features or elements of functionality may be individually described or claimed as separate modules, one of ordinary skill in the art will understand these features and functionality can be shared among one or more common software and hardware elements.

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present embodiments. For example, the semiconductor substrate may comprise a semiconductor wafer (e.g., silicon, SiGe, or an SOI wafer) or one or more die on a wafer, and any epitaxial layers or other type semiconductor layers formed there over or associated therewith. A portion or entire semiconductor substrate may be amorphous, polycrystalline, or single-crystalline. In addition to the aforementioned types of substrates, the semiconductor substrate employed in the present embodiments may also comprise a hybrid oriented (HOT) semiconductor substrate having surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

For the sake of convenience and clarity, terms such as "top," "bottom," "upper," "lower," "vertical," "horizontal," "lateral," and "longitudinal" will be used herein to describe the relative placement and orientation of components and their constituent parts as appearing in the figures. The terminology will include the words specifically mentioned, derivatives thereof, and words of similar import.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are only used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer that two elements are directly connected and in fixed relation to each other.

As used herein, an element or operation recited in the singular and proceeded with the word "a" or "an" is to be understood as including plural elements or operations, until such exclusion is explicitly recited. Furthermore, references to "one embodiment" of the present disclosure are not intended as limiting. Additional embodiments may also incorporate the recited features.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

Still furthermore, one of ordinary skill will understand when an element such as a layer, region, or substrate is referred to as being formed on, deposited on, or disposed "on," "over" or "atop" another element, the element can be directly on the other element or intervening elements may also be present. In contrast, when an element is referred to as being "directly on," "directly over" or "directly atop" another element, no intervening elements are present.

As used herein, "depositing" and/or "deposited" may include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RT-CVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A method, comprising:
    forming a stack of dynamic random access memory (DRAM) device layers;
    forming a metal-oxide-semiconductor (MOS) substrate directly atop the stack of DRAM device layers;
    forming a trench through the MOS substrate and the stack of DRAM device layers; and
    depositing a protection layer over the MOS substrate, wherein the protection layer is deposited at a non-zero angle of inclination relative to a vertical extending from a top surface of the MOS substrate, and wherein the protection layer is formed along a sidewall of the MOS substrate without being formed along the stack of DRAM device layers within the trench.

2. The method of claim 1, further comprising forming the protection layer along a sidewall of the MOS substrate within the trench.

3. The method of claim 1, wherein forming the stack of DRAM device layers comprises epitaxially growing a plurality of alternating layers of silicon and silicon germanium.

4. The method of claim 3, wherein forming the MOS substrate comprises epitaxially growing the MOS substrate directly atop the plurality of alternating layers of silicon and silicon germanium.

5. The method of claim 4, further comprising etching the stack of DRAM device layers without etching the MOS substrate.

6. The method of claim 5, wherein etching the stack of DRAM device layers comprises performing a lateral etch to remove one or more layers of silicon of the plurality of alternating layers of silicon and silicon germanium.

7. The method of claim 4, wherein the MOS substrate is silicon.

8. The method of claim 1, wherein depositing the protection layer comprises depositing at least one of the following materials directly atop the MOS substrate: dielectric oxide, silicon nitride, and silicon carbon nitride.

9. The method of claim 1, further comprising:
    removing the protection layer from over the MOS substrate; and
    depositing a capacitor film layer over one or more layers of the stack of DRAM device layers after the protection layer is removed.

10. A method of forming a dynamic random-access memory (DRAM) device, the method comprising:
    forming a stack of DRAM device layers;
    forming a complementary metal-oxide-semiconductor (CMOS) substrate directly atop the stack of DRAM device layers;
    forming a trench through the CMOS substrate and the stack of DRAM device layers; and
    depositing a protection layer over an upper surface and a sidewall of the CMOS substrate, wherein the protection layer is deposited at a non-zero angle of inclination relative to a vertical extending from a top surface of the CMOS substrate, and wherein the protection layer is prevented from being formed along the stack of DRAM device layers within the trench.

11. The method of claim 10, wherein forming the stack of DRAM device layers comprises epitaxially growing a plurality of alternating layers of silicon and silicon germanium.

12. The method of claim 11, wherein forming the CMOS substrate comprises epitaxially growing the CMOS substrate directly atop the plurality of alternating layers of silicon and silicon germanium.

13. The method of claim 12, further comprising etching the stack of DRAM device layers after the protection layer is deposited over the upper surface and the sidewall of the CMOS substrate.

14. The method of claim 13, wherein etching the stack of DRAM device layers comprises performing a lateral etch to remove one or more layers of silicon of the plurality of alternating layers of silicon and silicon germanium.

15. The method of claim 10, wherein the CMOS substrate is silicon, and wherein depositing the protection layer comprises depositing at least one of the following materials directly atop the CMOS substrate: dielectric oxide, silicon nitride, and silicon carbon nitride.

16. A method of forming a dynamic random-access memory (DRAM) device, the method comprising:
    epitaxially forming a stack of alternating silicon and silicon germanium layers;
    forming a complementary metal-oxide-semiconductor (CMOS) substrate directly atop the stack of alternating silicon and silicon germanium layers;

forming a trench through the CMOS substrate and through the stack of alternating silicon and silicon germanium layers; and depositing a protection layer over an upper surface and a sidewall of the CMOS substrate, wherein the protection layer is deposited at a non-zero angle of inclination relative to a vertical extending from a top surface of the CMOS substrate, and wherein the protection layer is prevented from being formed along the stack of alternating silicon and silicon germanium layers within the trench.

17. The method of claim 16, wherein forming the CMOS substrate comprises epitaxially growing a layer of silicon directly atop the plurality of alternating layers of silicon and silicon germanium.

18. The method of claim 16, further comprising etching the stack of alternating silicon and silicon germanium layers after the protection layer is deposited over the upper surface and the sidewall of the CMOS substrate.

19. The method of claim 18, wherein etching the stack of alternating silicon and silicon germanium layers comprises performing a lateral etch to remove one or more silicon layers of the stack of alternating silicon and silicon germanium layers.

20. The method of claim 16, wherein depositing the protection layer comprises depositing at least one of the following materials directly atop the CMOS substrate: dielectric oxide, silicon nitride, and silicon carbon nitride.

* * * * *